United States Patent
Yuan et al.

(10) Patent No.: US 11,726,264 B2
(45) Date of Patent: Aug. 15, 2023

(54) OPTICAL DEVICE HAVING WAVEGUIDE INTEGRATED MODULATOR AND LIGHT MONITORING AVALANCHE PHOTODIODE

(71) Applicant: Hewlett Packard Enterprise Development LP, Houston, TX (US)

(72) Inventors: Yuan Yuan, Milpitas, CA (US); Di Liang, Santa Barbara, CA (US)

(73) Assignee: Hewlett Packard Enterprise Development LP, Spring, TX (US)

(*) Notice: Subject to any disclaimer, the term of this patent is extended or adjusted under 35 U.S.C. 154(b) by 0 days.

(21) Appl. No.: 17/648,250

(22) Filed: Jan. 18, 2022

(65) Prior Publication Data

US 2023/0228943 A1    Jul. 20, 2023

(51) Int. Cl.
*G02B 6/12* (2006.01)
*G02B 6/293* (2006.01)
*H01L 31/107* (2006.01)

(52) U.S. Cl.
CPC ..... *G02B 6/29338* (2013.01); *G02B 6/12004* (2013.01); *G02B 6/2934* (2013.01); *G02B 6/29335* (2013.01); *H01L 31/107* (2013.01); *G02B 6/12019* (2013.01); *G02B 2006/12123* (2013.01)

(58) Field of Classification Search
CPC ............ G02B 6/12004; G02B 6/12019; G02B 6/29335; G02B 6/29338; G02B 6/2934; G02B 2006/12123; H01L 31/107
See application file for complete search history.

(56) References Cited

U.S. PATENT DOCUMENTS

| | | | |
|---|---|---|---|
| 7,965,914 B2 | 6/2011 | Xu et al. | |
| 8,554,022 B1 | 10/2013 | Hochberg et al. | |
| 8,897,606 B2* | 11/2014 | Asghari | G02F 1/2257 385/2 |
| 9,134,169 B2* | 9/2015 | Li | G01J 1/0209 |
| 9,184,865 B2* | 11/2015 | Akiyama | G02F 1/0147 |
| 9,437,759 B2 | 9/2016 | Baehr-Jones et al. | |
| 9,513,437 B2* | 12/2016 | Zhang | G02B 6/134 |
| 9,678,370 B2* | 6/2017 | Hui | G02F 1/0121 |
| 9,831,360 B2 | 11/2017 | Knights et al. | |
| 10,234,701 B2 | 3/2019 | Morton et al. | |

(Continued)

FOREIGN PATENT DOCUMENTS

CA         2500932 A1    9/2006

*Primary Examiner* — Ryan A Lepisto
(74) *Attorney, Agent, or Firm* — Hewlett Packard Enterprise (57) ABSTRACT

Examples described herein relate to an optical device, such as, a ring resonator, that includes a ring waveguide. The ring resonator includes a ring waveguide to allow passage of light therethrough. Further, the ring resonator includes a modulator formed along a first section of the circumference of the ring waveguide to modulate the light inside the ring waveguide based on an application of a first reverse bias voltage to the modulator. Moreover, the ring resonator includes an avalanche photodiode (APD) isolated from the modulator and formed along a second section of the circumference of the ring waveguide to detect the intensity of the light inside the ring waveguide based on an application of a second reverse bias voltage to the APD. The second section is shorter than the first section, and the second reverse bias voltage is higher than the first reverse bias voltage.

20 Claims, 7 Drawing Sheets

(56) References Cited

U.S. PATENT DOCUMENTS

| | | | |
|---|---|---|---|
| 11,237,333 B2* | 2/2022 | Bhargava | G01J 1/0425 |
| 11,442,235 B1* | 9/2022 | Liang | G01J 1/0407 |
| 2006/0226082 A1 | 10/2006 | Brook et al. | |
| 2020/0124884 A1 | 4/2020 | Cardenas et al. | |
| 2021/0013356 A1 | 1/2021 | Huang et al. | |
| 2023/0014190 A1* | 1/2023 | Yuan | G02B 6/4201 |

* cited by examiner

OPTICAL DEVICE HAVING WAVEGUIDE INTEGRATED MODULATOR AND LIGHT MONITORING AVALANCHE PHOTODIODE

STATEMENT OF GOVERNMENT RIGHTS

This invention was made with Government support under Agreement Number H98230-19-3-0002. The Government has certain rights in the invention.

BACKGROUND

Optical systems include optical devices that can generate, process, and/or carry optical signals from one point to another point. In certain implementations, optical systems such as optical communication systems may facilitate data communication over longer distances with higher bandwidth using smaller cable width (or diameter) in comparison to communication systems using electrical wires. In an optical communication system, light may be generated by a light source such as a laser. The light may be modulated by an optical transmitter, and demodulated by an optical receiver that includes photosensitive devices, for example. Also, certain optical systems entail use of optical ring resonators to implement optical modulators, a ring laser, or a ring filter.

BRIEF DESCRIPTION OF THE DRAWINGS

Various examples will be described below with references to the following figures.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, the same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

Resonators such as ring resonators (also commonly referred to as optical micro-ring resonators) are widely used as components in various optical applications such as modulators, lasers, or filters. Typically, a ring resonator includes a ring waveguide and a coupling waveguide that is disposed adjacent to, and evanescently coupled to, the ring waveguide. At a resonant wavelength of the ring resonator, the optical signal interferes constructively inside the ring resonator. A resonant wavelength of the ring resonator is a function of an effective refractive index of the ring waveguide. A desired resonant wavelength may be achieved by tuning the effective refractive index which is a temperature-dependent parameter. Typically, in some known implementations, the resonant wavelength may be tuned via thermal tuning mechanisms, for example, via resistive heating techniques while monitoring a resonant wavelength of the ring resonator.

Systems to monitor the resonant wavelength commonly use a drop port that is optically coupled to the ring resonator to obtain, at the drop port, at least a portion of the optical signal being transmitted in the ring waveguide. In certain traditional implementations, a drop bus waveguide including one or more drop ports is optically coupled to the ring resonator, in particular, to the ring waveguide, such that at least a portion of the optical signal being transmitted in the ring waveguide is received at the drop port. One or more photodiodes (PDs) are installed at the drop port to aid in the monitoring of the optical signal received at the drop port.

Use of additional structural elements such as the drop bus waveguide with one or more drop ports and corresponding one or more PDs require additional space leading to an increase in overall footprint of the ring resonator and may require other design compromises with respect to the internal structure and efficiency of the ring resonator. For example, to save space for the drop bus waveguide in a ring modulator, an effective doping region (e.g., a coupling region between the drop bus and the ring waveguide) is reduced. Such a reduction in the effective doping region leads to reduced modulation efficiency. Further, the use of the drop port entails transmitting at least a portion of the light out of the ring resonator, in particular, out of the ring waveguide of the ring resonator, which introduces power loss. This in turn reduces the Q-factor (e.g., a ratio of an optical power stored/confined within a ring waveguide of the ring resonator and an optical power loss from the ring waveguide) of the ring resonator.

Further, the amount of photon absorption by a PD depends on material used to form the PD. In particular, for a photon to be absorbed by the PD, the photon energy needs to be higher than an energy bandgap of the material receiving the photon. For example, for silicon-based ring resonators, the bandgap of about 1.12 eV may be too wide to absorb photons with longer wavelengths, for example, wavelengths typically used in telecommunication applications. Therefore, typically, a narrow bandgap semiconductor material, such as germanium, is used to form a photodiode to detect such wavelengths. Due to process steps for epitaxial growth of Ge on the Si, formation of the Ge photodiode introduces additional fabrication steps, time, and cost.

In accordance with one or more examples presented herein, an optical device, such as, a ring resonator, is presented that includes a ring waveguide, a photodiode, and a modulator integrated within a device structure of the optical device along with the ring waveguide. In particular, the proposed ring resonator may include a ring waveguide to allow passage of light therethrough. Further, the ring resonator may include a modulator formed along a first section of the circumference of the ring waveguide to modulate the light inside the ring waveguide based on an application of a first reverse bias voltage to the modulator. Moreover, the ring resonator may include an avalanche photodiode (APD) isolated from the modulator and formed along a second section of the circumference of the ring waveguide to detect the intensity of the light inside the ring waveguide based on an application of a second reverse bias voltage to the APD. In the description hereinafter, the term "first section" where the modulator is also referred to as a modulator section. Similarly, in the description hereinafter, the term "second section" where the APD is also referred to as an APD section.

The APD and the modulator of some examples disclosed herein are designed such that even lower energy photons are detected by a much shorter the APD. This is accomplished by applying a second reverse bias voltage to the APD which is higher than the first reverse bias voltage applied to the modulator. The application of the higher second reverse bias voltage causes steep band structure across a depletion region (e.g., PN junction) formed inside the ring waveguide (made of, for example, Si) along the APD section. The steep band structure reduces the effective potential barrier width across the depletion region. Accordingly, charge carriers (e.g., electrons and holes) can cross (e.g., tunnel through) such narrow potential barrier easily upon absorbing low energy photons, such phenomenon is commonly referred to as photon assisted tunneling (PAT). In particular, with the application of the higher reverse bias voltage and the increased PAT probability, even lower energy photons can be detected in the smaller APD section along the Silicon ring waveguide. As a result, a larger area of the ring waveguide is available for the modulator to achieve better modulation efficiency. Therefore, in some examples, to achieve improved modulation efficiency, a ratio of a circumferential length of the first section (i.e., the modulator section) where the modulator is formed to a circumferential length of the second section (i.e., the APD section) is in a range from 2:1 to 10:1. In certain examples, the circumferential length of the modulator section is more than half of the circumference of the ring waveguide.

In the proposed optical device, both light modulation and light monitoring may be performed in a single device structure. As will be appreciated, the use of the modulator and the APD in the same device can save a lot of chip space and makes an optical system that uses such ring resonator more integrated and compact, in comparison to traditional optical devices that use a drop port and photodiode at the drop port to monitor light. Further, both the modulator and the APD may be formed using the same process in the respective sections along the circumference of the ring waveguide. As such, in some examples, additional steps such as Ge epitaxial growth and related ion implantation may be avoidable during the fabrication processes. Consequently, fabrication complexity, time, and cost are reduced. In some examples, the APD formed in the proposed ring resonator may be an all-silicon PN junction photodiode that has good uniformity, and which saves valuable space inside the ring resonator. Further, the responsivity of the APD can be adjusted by controlling its reverse bias voltage (e.g., the second reverse bias voltage) which results in a simpler adjustment for monitoring light. Moreover, the proposed ring resonator can be fabricated with standard Si photonics foundry, allowing large-scale industrial fabrication.

Figure 1A:
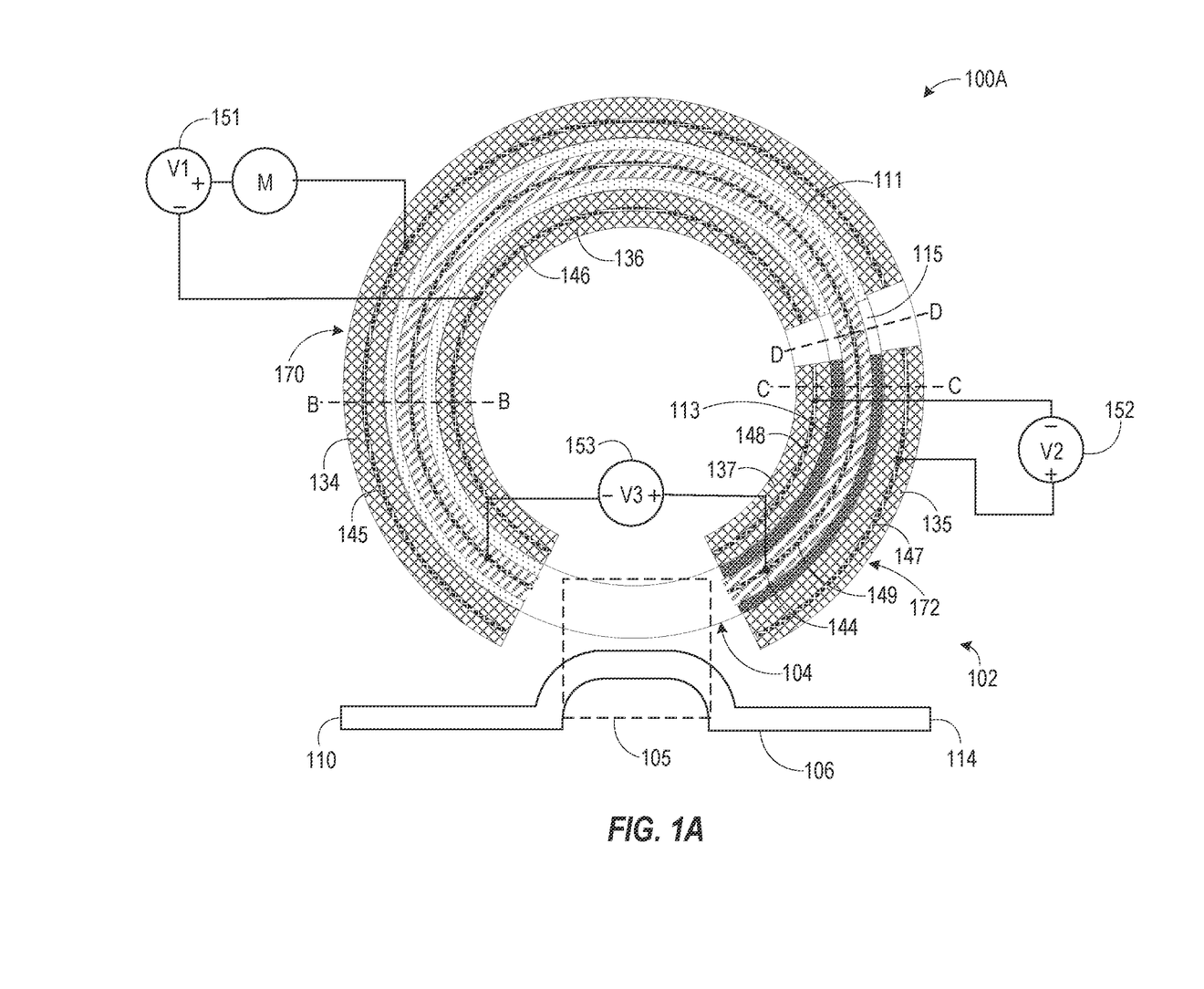
FIG. 1A depicts a top view of an example ring resonator having a modulator and an avalanche photodiode (APD) integrated with a ring waveguide formed in the ring resonator.

Referring now to the drawings, FIG. 1A depicts a top view 100A of an example optical device, for example, a ring resonator 102. The ring resonator 102 may be a semiconductor-based optical micro-ring device suitable for several applications such as, but not limited to, a ring modulator, a ring laser, and a ring filter. The ring resonator 102 and/or the devices using the ring resonator may be deployed in an electronic system such as a system that may include processing resources, electronic circuits, and/or storage media to process and/or store data. Examples of the electronic system that may use such ring resonator 102 may include, but are not limited to, computers (stationary or portable), servers, storage systems, wireless access points, network switches, routers, docking stations, printers, or scanners. Such electronic system may be offered as a stand-alone product, a packaged solution, and can be sold on a one-time full product/solution purchase or on a pay-per-use basis.

The ring resonator 102 may include a ring waveguide 104 and a coupling waveguide 106 disposed sufficiently close to the ring waveguide 104 to provide evanescent coupling through coupling region 105. The coupling waveguide 106 may include an input port 110 and an output port 114. An optical signal may be supplied to the ring resonator 102 via the input port 110 and a signal having a wavelength equal to a resonant wavelength of the ring waveguide 104 may be coupled into (e.g., trapped inside) the ring waveguide 104. In addition, the ring resonator 102 may include a modulator 170 (described later) and an avalanche photodiode (APD) 172 (described later) formed along respective certain portions of the circumference of the ring waveguide 104. During the operation of the ring resonator 102, the modulator 170 may aid in modulating the light inside the ring waveguide 104 on the application of a first reverse bias voltage to the modulator 170. Further, the APD 172 may aid in monitoring the intensity of the light inside the ring waveguide 104 on the application of a second reverse bias voltage and without diverting any portion of the light outside of the ring waveguide 104.

Figure 1B:
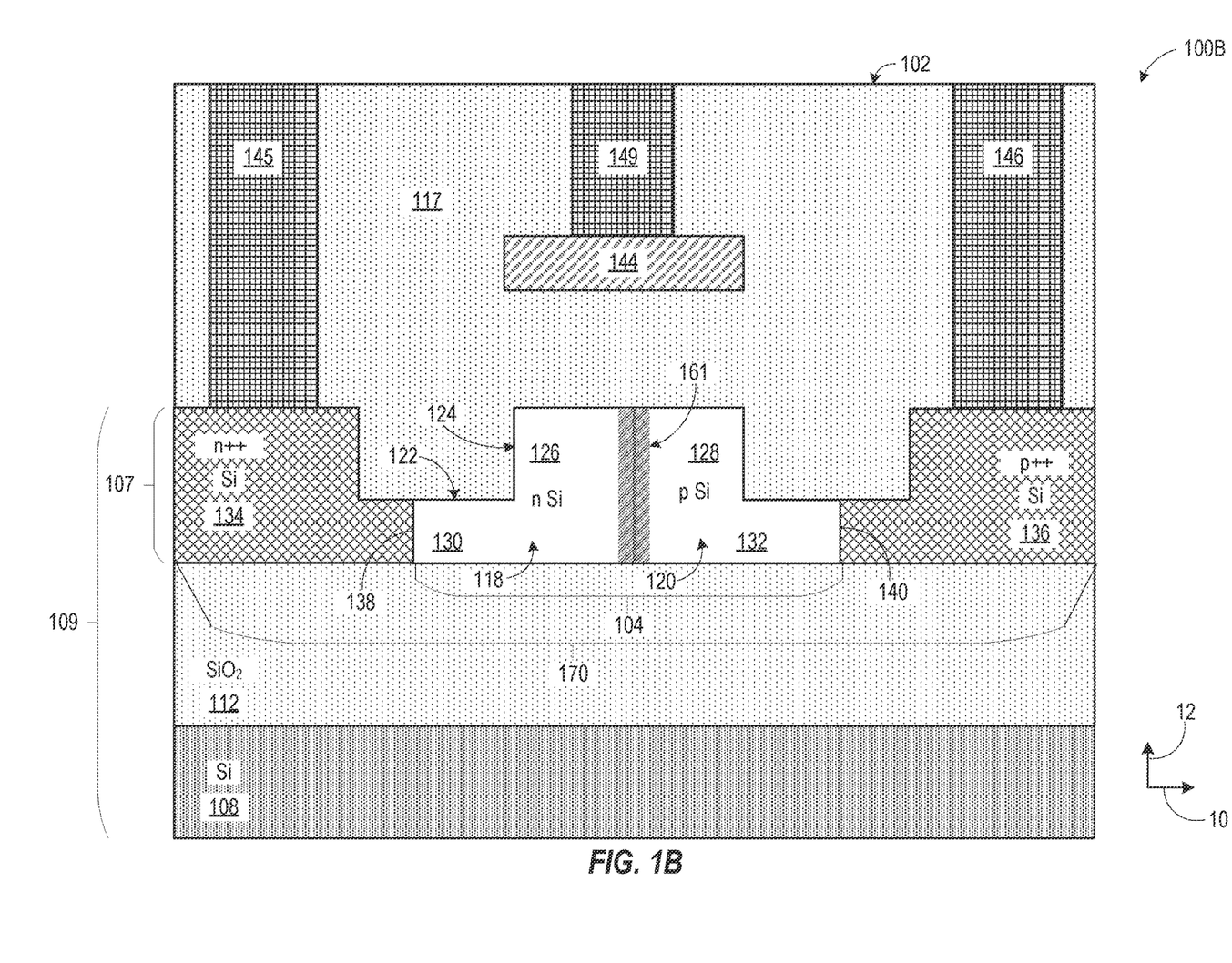
FIG. 1B depicts a cross-sectional view of the ring resonator of FIG. 1A at a first location along a first section where the modulator is formed.
Figure 1C:
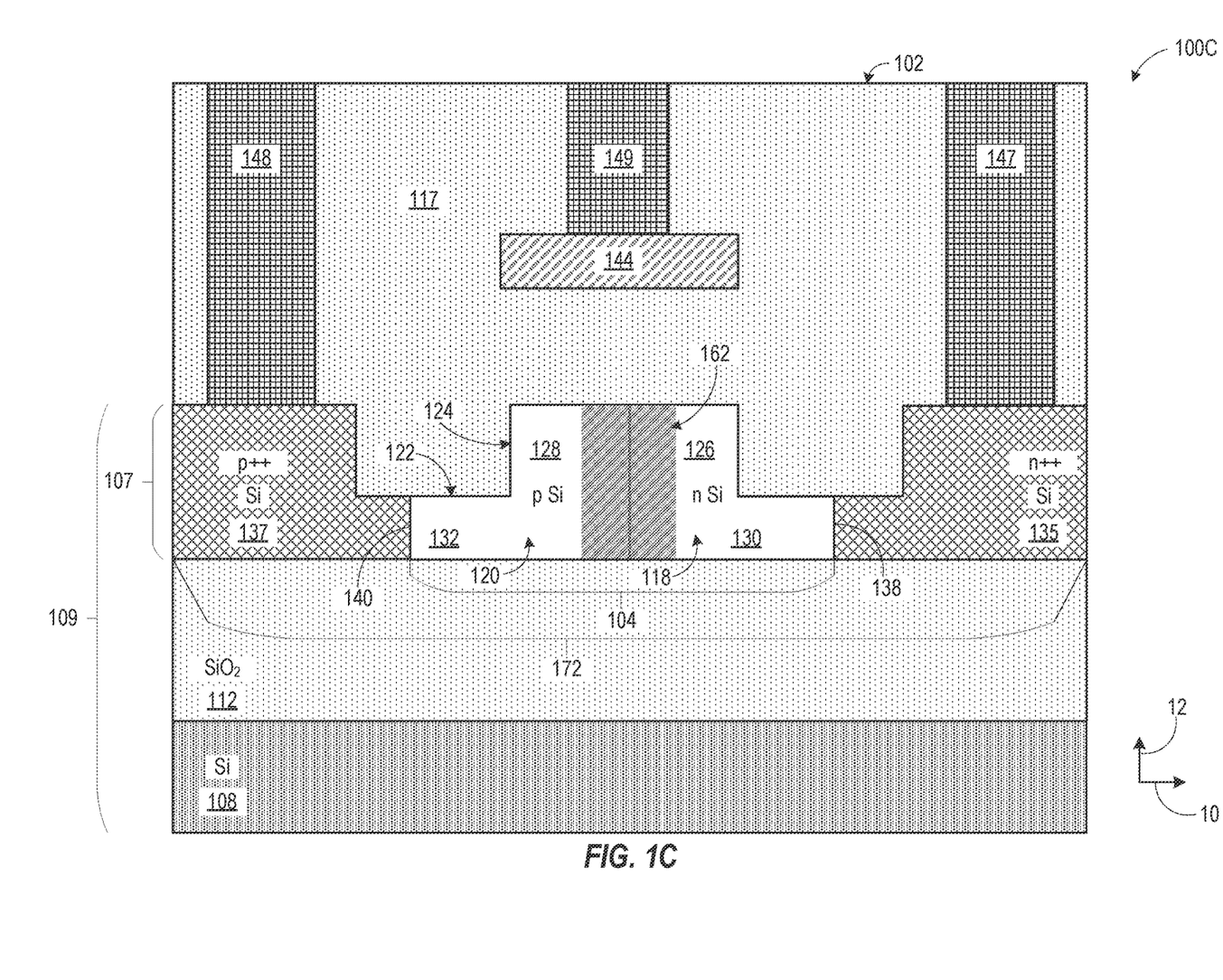
FIG. 1C depicts a cross-sectional view of the ring resonator of FIG. 1A at a second location along a second section where the APD is formed.
Figure 1D:
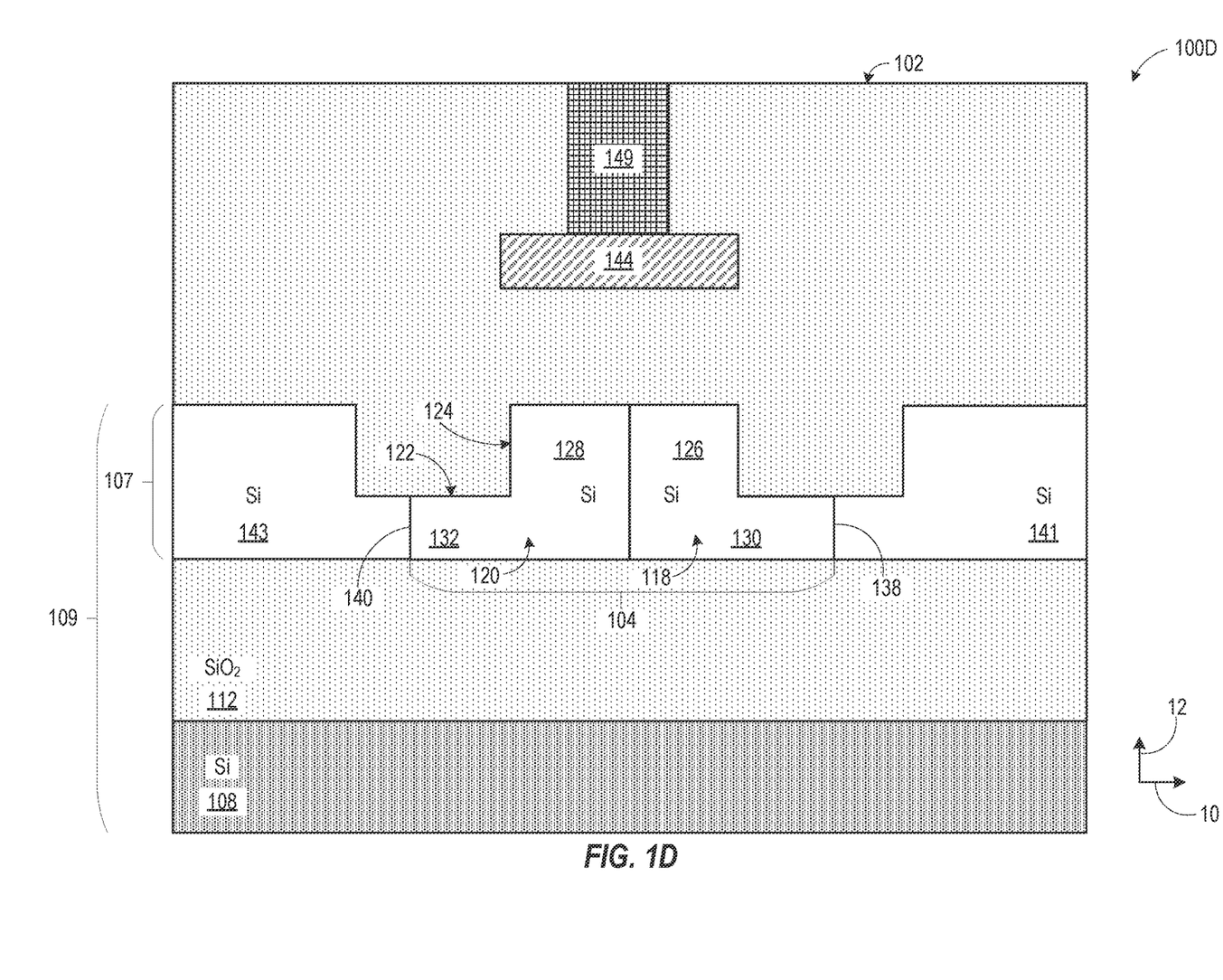
FIG. 1D depicts a cross-sectional view of the ring resonator of FIG. 1A at a third location along a third section that isolates the modulator and the APD.

FIG. 1B depicts a cross-sectional view 100B of the ring resonator 102 at a first location (e.g., location B-B marked in FIG. 1A) along a first section 111 (also referred to as a modulator section 111 hereinafter) of a circumference of the ring waveguide 104; FIG. 1C depicts a cross-sectional view 100C of the ring resonator 102 at a second location (e.g., location C-C) along a second section 113 (also referred to as an APD section 113 hereinafter); and FIG. 1D depicts a cross-sectional view 100D of the ring resonator 102 at a third location (e.g., location D-D) along a third section (also referred to as an isolating section 115 hereinafter). In FIGS. 1B-1D, arrows 10 and 12 show a radial direction and a vertical direction ("radial direction 10" and "vertical direction 12"). In the description hereinafter, FIGS. 1A-1D are generally referenced concurrently. For clarity of representation, certain regions/layers of the ring resonator 102 shown in FIGS. 1B-1D are not shown in the top view 100A of FIG. 1A.

Turning now to FIGS. 1B-1D, in some examples, one or both of the ring waveguide 104 and the coupling waveguide 106 may be formed using a semiconductor wafer 109. In some examples, the semiconductor wafer 109 may be a silicon on insulator (SOI) substrate that may include a base substrate layer 108, a base oxide layer 112, and a device layer 107. The base substrate layer 108 may be made of semiconductor material, for example, silicon (Si). Other examples of materials that may be used to form the base substrate layer 108 may include III-V semiconductors, such as indium phosphide (InP), germanium (Ge), gallium arsenide (GaAs), aluminum gallium arsenide (AlGaAs), indium gallium arsenide (InGaAs), indium arsenide (InAs), or combinations thereof.

The base oxide layer 112 may be formed by oxidizing the base substrate layer 108. In the implementation of FIGS. 1B-1D, for the base substrate layer 108 made of silicon, the base oxide layer 112 may comprise silicon dioxide ($SiO_2$), which may be formed in the presence of oxygen at a temperature in the range from 900° C. to 1380° C. In some examples, the base oxide layer 112 may be a buried oxide (BOX) layer (e.g., the $SiO_2$ may be buried in the base substrate layer 108). In some examples, a layer of the $SiO_2$ may be buried in the base substrate layer 108 at a depth ranging from less than 100 nm to several micrometers from the wafer surface depending on the application. Other examples of the base oxide layer 112 may include, but are not limited to, Silicon Nitride ($Si_3N_4$), Aluminum oxide ($Al_2O_3$), Hafnium Dioxide ($HfO_2$), diamond, silicon carbide (SiC), or combinations thereof.

The device layer 107 may be disposed on top of the base oxide layer 112. In the example implementation of FIG. 2, the device layer 107 is composed of silicon. The device layer 107 may be suitably shaped (e.g., via techniques such as photolithography and etching) to form one or more regions, such as, the ring waveguide 104, the coupling waveguide 106, and contact regions (described later).

Also, for illustration purposes, the ring waveguide 104 is shown to have a circular shape (FIG. 1A). In some examples, the ring waveguide 104 may have any other shapes, for example, a loop of any shape (e.g., oval loop, rounded rectangle loop, rounded square loop, rounded triangle loop, etc.) without limiting the scope of the present disclosure. By way of example, the ring waveguide may have an elongated loop shape (e.g., a racetrack shape). The ring waveguide 104 may include an outer annular region 118 and an inner annular region 120. The outer annular region 118 may be disposed in contact with and annularly surrounding the inner annular region 120 outwardly in the radial direction 10. Both the outer annular region 118 and the inner annular region 120 may be formed of the same material (e.g., Si), but may be differently doped. For example, the outer annular region 118 may have a first-type doping, except in the isolating section 115. Further, the inner annular region 120 may have a second-type doping, except in the isolating section 115. The second-type doping is different from the first type-doping. The absence of doping in the isolating section 115 of the annular regions 118 and 120 electrically isolates the modulator section 111 from the APD section 113. For illustration purposes, the first-type doping is described as N-type and the second-type doping is described as P-type. In other examples, the first-type doping may be P-type and the second-type doping may be N-type. For illustration purposes, the outer annular region 118 is shown to include the first-type (i.e., N-type) doping, and the inner annular region 120 is to include the second-type (i.e., P-type) doping.

In some examples, the ring waveguide 104 may be shaped to have a waveguide base 122 and a waveguide core 124 that is narrower than the waveguide base 122. The outer annular region 118 and the inner annular region 120 are shaped accordingly to the desired overall shape of the ring waveguide 104. For example, the outer annular region 118 may have an L-shaped cross-section (see FIGS. 1B-1D). In this example, the inner annular region 120 may have a mirrored L-shaped cross-section (see FIGS. 1B-1D). In particular, the waveguide core 124 may include the combined region formed by upper regions 126, 128 of the annular regions 118, 120, respectively. Similarly, the waveguide base 122 may include the combined region formed by lower regions 130, 132 of the annular regions 118, 120, respectively. Because the upper regions 126, 128 are thinner than the lower regions 130, 132, the waveguide core 124 is narrower than the waveguide base 122. Accordingly, during the operation of the ring resonator 102, the confined mode may be located mainly within the waveguide core 124. In some other examples, the ring waveguide 104 may have a square or a rectangular cross-section and does not have a differently shaped waveguide core and waveguide base.

Furthermore, in some examples, as depicted in FIGS. 1A and 1B, the modulator 170 may include one or more contact regions, for example, a first outer contact region 134 and a first inner contact region 136, hereinafter collectively referred to as first contact regions 134 and 136 or simply contact regions 134 and 136, formed in the device layer 107. The first contact regions 134 and 136 be formed by suitably shaping (e.g., etching) the device layer 107 and performing impurity doping as indicated with reference to the first contact regions 134 and 136. The first outer contact region 134 may be formed in contact with the outer annular region 118 along the modulator section 111 of the circumference of the ring waveguide 104. In particular, the first outer contact region 134 may be formed in contact with an outer annular boundary 138 of the waveguide base 122. Further, the first inner contact region 136 may be formed in contact with the inner annular region 120 along the modulator section 111. In particular, the first inner contact region 136 may be formed in contact with an inner annular boundary 140 of the waveguide base 122. As such, the first contact regions 134 and 136 are formed such that, in the modulator section 111, the ring waveguide 104 is radially sandwiched between the outer contact region 134 and the inner contact region 136.

Moreover, in some examples, as depicted in FIGS. 1A and 1C, the APD 172 may include one or more contact regions, for example, a second outer contact region 135 and a second inner contact region 137, hereinafter collectively referred to as second contact regions 135 and 137, formed in the device layer 107. The second contact regions 135 and 137 be formed by suitably shaping (e.g., etching) the device layer 107 and performing impurity doping as indicated with reference to the second contact regions 135 and 137. The second outer contact region 135 may be formed in contact with the outer annular region 118 along the APD section 113 of the circumference of the ring waveguide 104. In particular, the second outer contact region 135 may be formed in contact with an outer annular boundary 138 of the waveguide base 122. Further, the second inner contact region 137 may be formed in contact with the inner annular region 120 along the APD section 113 of the circumference of the ring waveguide 104. In particular, the second inner contact region 137 may be formed in contact with an inner annular boundary 140 of the waveguide base 122. As such, the second contact regions 135 and 137 are formed such that, in the APD section 113, the ring waveguide 104 is radially sandwiched between the outer contact region 135 and the inner contact region 137.

In some examples, the outer contact regions 134, 135 may include the first-type doping, and the inner contact regions 136, 137 may include the second-type doping. Accordingly, in the examples of FIGS. 1B and 1C, the outer contact regions 134, 135 are shown to include the N-type doping, and the inner contact regions 136, 137 are shown to include the P-type doping. In some examples, the contact regions 134, 135 136, 137 may have a higher concentration of respective doping in comparison to doping concentrations in the annular regions 118, 120 of the ring waveguide 104. Accordingly, the contact regions 134, 135, 136, 137 may be considered as highly doped regions and are marked with labels "n++" and "p++" as depicted in FIGS. 1B and 1C. In some examples, along the modulator section 111 and the APD section 113, the outer annular region 118 and the inner annular region 120 may not be as highly doped and are marked with "n" and "p," respectively. Along the isolating section 115, the outer annular region 118 and the inner annular region 120 may be undoped. Accordingly, the outer annular region 118 and the inner annular region 120 may be referred to as undoped or lightly doped regions.

Further, to allow controlled tuning of an operating wavelength (e.g., a wavelength of the light inside the ring waveguide) of the ring resonator 102, the ring resonator 102 may include a thermal element, for example, a metal heater 144 that is disposed near the ring waveguide 104. In particular, the metal heater 144 may be formed annularly over the ring waveguide 104 to cause a shift in the operating wavelength of the light inside based on an application of a third voltage to the metal heater 144. Formation of the metal heater 144 on top of the ring waveguide 104 may help in achieving enhanced thermal tuning. Also, due to the use of the separate metal heater 144 from the ring waveguide 104, no additional doping regions are needed to be created in the ring waveguide 104.

Moreover, in some examples, the ring resonator 102 may include metal contacts, such as, a first metal contact 145, a second metal contact 146, a third metal contact 147, a fourth metal contact 148, and a fifth metal contact 149 (hereinafter collectively referred to as metal contacts 145-149). As depicted in FIG. 1B, the first metal contact 145 is formed in contact with the first outer contact region 134, and the second metal contact 146 is formed in contact with the first inner contact region 136. Further, as depicted in FIG. 1C, the third metal contact 147 is formed in contact with the second outer contact region 135, and the fourth metal contact 148 is formed in contact with the second inner contact region 137. As can be seen in FIGS. 1B-1D, the fifth metal contact 149 is formed in contact with the metal heater 144.

In some examples, the ring resonator 102 may include an electrically insulating layer 117 disposed over the exposed surfaces of the ring waveguide 104, the contact regions 134, 136, 135, 137, and the metal heater 144. Examples of the electrically insulating layer 117 may include $SiO_2$, $Si_3N_4$, $Al_2O_3$, $HfO_2$, polyimide, BCB, or the like. In some examples, the metal contacts 145, 146, 147, 148, 149 are formed on top of (i.e., vertically over) the contact regions 134, 136, 135, 137, and the metal heater 144, respectively. To form the metal contacts 145, 146, 147, 148, and 149 the electrically insulating layer 117 may be etched or lithographically defined to form respective vias until the contact regions 134, 136, 135, 137, and the metal heater 144, respectively, are reached. Once the vias are formed, a conducting material (e.g., metal) is filled into the vias to form the metal contacts 145, 146, 147, 148, 149. Examples of materials used to form the metal contacts 145, 146, 147, 148, 149 may include, but are not limited to, Copper (Cu), Gold (Au), Al, Platinum (Pt), and the like.

As shown in the top view 100A, the isolating section 115 may represent a portion along the circumference of the ring waveguide 104 that does not include any of the modulator 170 or the APD 172. Referring now to the cross-section view 100D of FIG. 1D at the location D-D, along the isolating section 115, the regions 141 and 143 of the device layer 107 and the annular regions 118 and 120 of the ring waveguide 104 are kept intrinsic or undoped. Therefore, the isolating section 115 may act as an electrical insulator between the modulator 170 or the APD 172. Also, the ring resonator 102 may not include metal contacts in the isolating section 115.

During operation, the modulator 170 may be operated by applying a first reverse bias voltage (V1), the APD may be operated by applying a second reverse bias voltage (V2), and the metal heater 144 may be operated by applying a third voltage (V3). To apply the first reverse bias voltage (V1) across the contact regions 134, 136 of the modulator 170, a power source 151 may be electrically connected to the metal contacts 145 and 146. Similarly, to apply the second reverse bias voltage (V2) across the contact regions 135, 137 of the APD 172, a power source 152 may be electrically connected to the metal contacts 147 and 148. Further, to apply the third voltage (V3) to the metal heater 144, a power source 153 may be connected to the fifth metal contact 149, at any two locations along the fifth metal contact 149, as depicted in FIG. 1A. Upon application of the third voltage (V3) to two locations along the fifth metal contact 149, the metal heater 144 may generate heat responsive to the magnitude of the third voltage. In particular, in some examples, the heat generated by the metal heater 144 may be proportional to a square of the magnitude of the third voltage (V3). The heat generated by the metal heater 144 may locally heat the ring waveguide 104 causing a local change in the refractive index of the material of the ring waveguide 104. The change in the refractive index may cause the operating wavelength of the ring resonator 102 to vary.

Further, upon application of the first reverse bias voltage (V1) across the contact regions 134, 136 of the modulator 170 via the 145 and 146, the ring resonator 102, in the modulator section 111, may be operated in a charge carrier depletion mode. In particular, in charge carrier depletion mode, a depletion region 161 between the outer annular region 118 and the inner annular region 120 in the modulator section 111 may increase in size due to a reduction in the charge carrier concentration near a junction between the outer annular region 118 and the inner annular region 120. The reduction in the charge carrier concentration may cause an increase in the refractive index of the ring waveguide 104. In particular, upon application of the first reverse bias voltage, the refractive index within the waveguide core 124 may increase. Consequently, the optical signal may be mostly confined within the ring waveguide 104, in particular, in the waveguide core 124. In some examples, the first reverse bias voltage applied across the contact regions 134, 136 is modulated by a modulating signal (M). In particular, when the first reverse bias voltage is modulated, the refractive index within the waveguide core 124 may vary in accordance with the modulating signal (M) and a modulated light output may be collected at the output port 114.

In some examples, to achieve improved modulation efficiency, the modulator 170 and the APD 172 are formed such that a ratio of a circumferential length of the modulator section 111 to a circumferential length of the APD section 113 is kept in a range from 2:1 to 10:1. In certain examples, as depicted in FIG. 1A, the modulator 170 is formed such that the circumferential length of the modulator section 111 is more than half of the circumference of the ring waveguide 104.

Figure 2A:
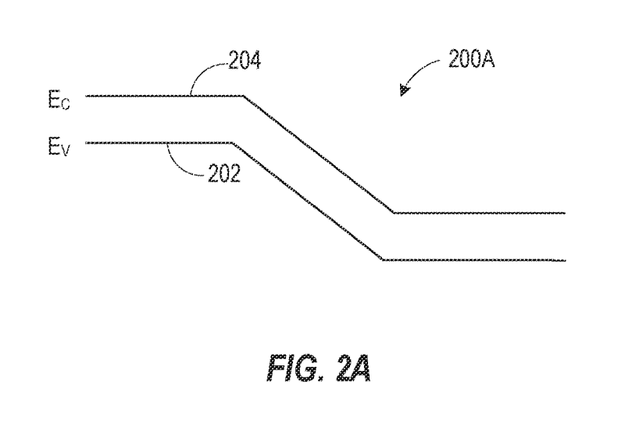
FIG. 2A depicts an energy band structure of the modulator of FIG. 1A the when the modulator is operated at a first reverse bias voltage.
Figure 2B:
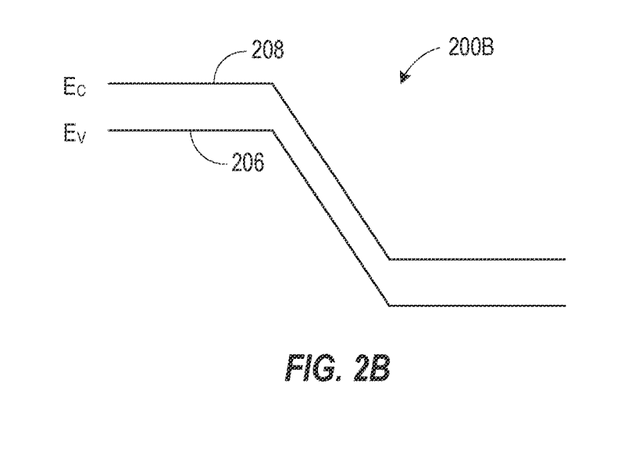
FIG. 2B depicts an energy band structure of the APD of the ring resonator shown in FIG. 1A when the APD is operated at a second reverse bias voltage.

FIGS. 2A and 2B depict energy band structures 200A and 200B respectively of the modulator 170 when operated at a first reverse bias voltage (V1) and the APD 172 when operated at the second reverse bias voltage (V2). In the band structures 200A and 200B, the labels $E_v$ and $E_c$ represent energy levels of the valance band and conduction band, respectively. The energy band structure 200A is shown to include energy band lines 202 and 204 respectively representing energy levels corresponding to a conduction band and a valance band for the device layer 107 made of Si in the modulator section 111. A distance between the energy band lines 202 and 204 may represent a bandgap indicative of energy required for a charge carrier (e.g., an electron) to become free by moving from the valance band to the conduction band. The energy band lines 202 and 204 may have different slopes depending on the electric field appearing across the depletion region 161 between the regions 118 and 120 material properties (e.g., doping concentration and/or lattice structure) of the regions 118 and 120 in the modulator 170. In particular, the electric field appearing across the depletion region 161 is dependent on the magnitude of the first reverse bias voltage (V1).

In the band structure 200B, energy band lines 206 and 208 respectively represent energy levels corresponding to a conduction band and a valance band for the device layer 107 made of Si when the second reverse bias voltage (V2>V1) is applied to the APD 172. A distance between the energy band lines 206 and 208 may represent a bandgap indicative of an energy required for a charge carrier (e.g., an electron) to become free by moving from the valance band to the conduction band. The band lines 206 and 208 may have different slopes depending on the electric field across the depletion region 162 between the regions 118 and 120 material properties (e.g., doping concentration and/or lattice structure) of the regions 118 and 120 in the APD 172. In particular, the electric field appearing across the depletion region 162 is dependent on the magnitude of the second reverse bias voltage (V2).

As previously noted, the second reverse bias voltage (V2) is higher than the first reverse bias voltage such that the slope of the energy band lines 206 and 208 is steeper in comparison to the energy band lines 202 and 204 resulting in a reduced energy bandgap along the APD section 113. As such, the steep band structure depicted in FIG. 2B reduces the effective potential barrier width. Accordingly, charge carriers (e.g., electrons and holes) can cross (e.g., tunnel through) such narrow potential barrier easily upon absorbing low energy photons, such phenomenon is commonly referred to as photon assisted tunneling (PAT). As such, with the application of the higher second reverse bias voltage to the APD 172, the probability of PAT increases exponentially. Also, as previously noted, the application of the higher reverse bias voltage to the APD 172, causes an impact ionization thereby generating free charge carriers (e.g., electrons and holes) in the depletion region 162 resulting in an avalanche of free charge carriers, also commonly referred to as avalanche effect. The avalanche effect further increases the responsivity of the APD 172. In particular, with the application of the higher reverse bias voltage (e.g., V2) and the increased PAT probability and/or the avalanche effect, even lower energy photons can be detected in the smaller APD section 113 along the Silicon ring waveguide 104. Consequently, as noted earlier, a larger area of the ring waveguide 104 is available for the modulator 170 to achieve better modulation efficiency.

Figure 3:
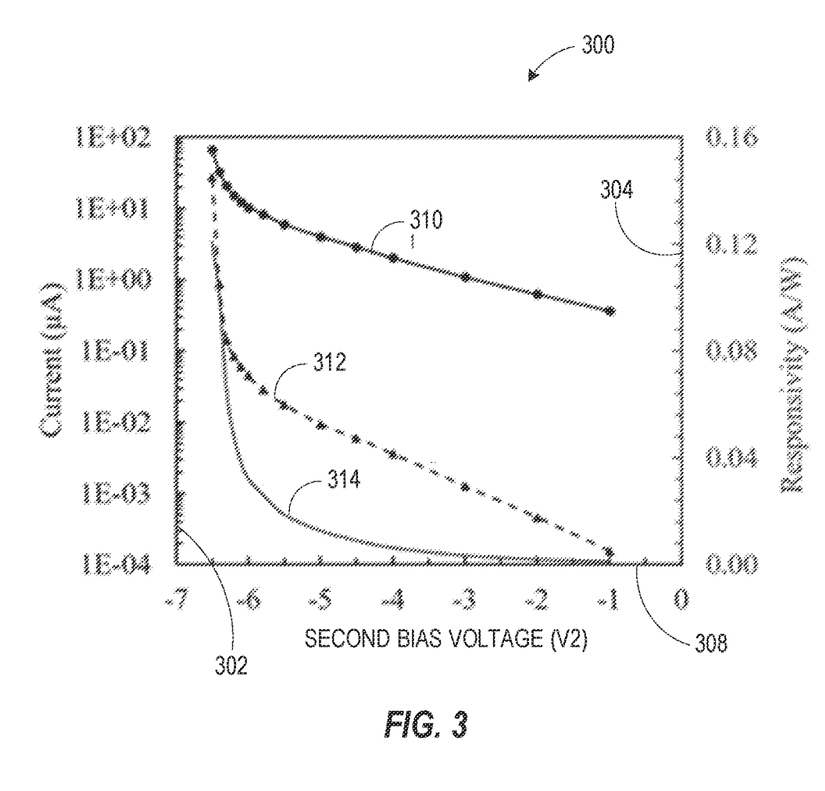
FIG. 3 depicts a graphical representation (also referred to as an I-V curve) showing a relationship between a current measured through an APD, a second reverse bias voltage applied to the APD, and a responsivity of the APD.

FIG. 3 depicts a graphical representation 300 (also referred to as an I-V curve) showing a relationship between a current measured through the APD 172, the second reverse bias voltage (V2), and a responsivity of the APD 172. For the graphical representation 300, the APD 172 is considered to span along about 50% of the circumference of the ring waveguide 104 with a resonant wavelength around 1310 nm. In the graphical representation 300, a left side Y-axis 302 represents the current measured through the APD 172 in micro-amperes (μA), a right-side Y-axis 304 represents responsivity of the APD 172 in amperes/watt (A/W), and an X-axis 308 represents magnitudes of the second reverse bias voltage (V2) in volts (V). Further, a curve 310 represents variations in the responsivity with variations in the second reverse bias voltage (V2); a curve 312 represents variations in a dark current with variations in the second reverse bias voltage (V2); and a curve 314 represents variations in a total current with variations in the second reverse bias voltage (V2). The term 'responsivity' as used herein may refer to a ratio of an output photocurrent of the APD 172 and optical power inside a waveguide (e.g., the ring waveguide 104). The output photocurrent of the APD 172 may be obtained by subtracting the dark current from the current measured through the APD 172. The dark current may be referred to as a current that is generated by the APD 172 when no light is impinging on the APD 172. Generally, the dark current is very small compared to the output photocurrent of the APD 172.

As can be observed from the graphical representation 300, the responsivity (e.g., the curve 310) increases with the increase in the second reverse bias voltage (V2). In some examples, such an increase in the responsivity may be due to reasons, such as but not limited to, an increase in the PAT probability with an increase in the second reverse bias voltage (V2); an increase in an overlap between the depletion region 162 and the waveguide optical mode with the increase in the second reverse bias voltage (V2); increased electric field up to about $5\times10^7$ V/m which is high enough to generate impact ionization like at the reverse bias voltage of about −6.4 V. in some cases, the responsivity of the APD 172 may go up to about 0.12 A/W. Such a high responsivity allows a shorter APD 172 which can still be a good monitor. In comparison to traditional implementations using the drop port monitor, the proposed ring resonator 102 is a single device with two functions—modulation using the modulator 170 and monitoring using the APD 172, which saves a lot of chip space and makes the optical system more compact.

Figure 4:
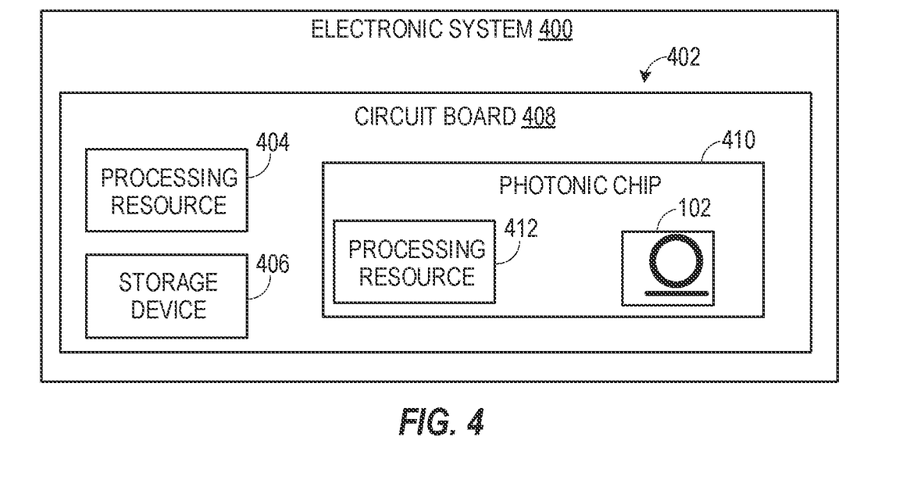
FIG. 4 depicts a block diagram of an example electronic system having the ring resonator of FIGS. 1A-1D.

Referring now to FIG. 4, a block diagram of an example electronic system 400 is presented. Examples of the electronic system 400 may include, but are not limited to, computers (stationary or portable), servers, storage systems, wireless access points, network switches, routers, docking stations, printers, or scanners. The electronic system 400 may be offered as a stand-alone product, a packaged solution, and can be utilized on a one-time full product/solution purchase or pay-per-use basis. The electronic system 400 may include one or more multi-chip modules, for example, a multi-chip module (MCM) 402 to process and/or store data. In some examples, the MCM 402 may include a processing resource 404 and a storage medium 406 mounted on a circuit board 408. Also, in some examples, the MCM 402 may host a photonics chip 410 on the circuit board 408. In some other examples, one or more of the processing resource 404, the storage medium 406, and the photonics chip 410 may be hosted on separate MCM (not shown). The circuit board 408 may be a printed circuit board (PCB) that includes several electrically conductive traces (not shown) to interconnect the processing resource 404, the storage medium 406, and the photonics chip 410 with each other and/or with other components disposed on or outside of the PCB.

The processing resource 404 may be a physical device, for example, one or more central processing units (CPUs), one or more semiconductor-based microprocessors, microcontrollers, one or more graphics processing unit (GPU), application-specific integrated circuit (ASIC), a field-programmable gate array (FPGA), other hardware devices, or combinations thereof, capable of retrieving and executing the instructions stored in the storage medium 406. The processing resource 404 may fetch, decode, and execute the instructions stored in the storage medium 406. As an alternative or in addition to executing the instructions, the processing resource 404 may include at least one integrated circuit (IC), control logic, electronic circuits, or combinations thereof that include a number of electronic components. The storage medium 406 may be any electronic, magnetic, optical, or any other physical storage device that contains or stores instructions that are readable and executable by the processing resource 404. Thus, the storage medium 406 may be, for example, Random Access Memory (RAM), non-volatile RAM (NVRAM), an Electrically Erasable Programmable Read-Only Memory (EEPROM), a storage device, an optical disc, and the like. In some embodiments, the storage medium 406 may be a non-transitory storage medium, where the term "non-transitory" does not encompass transitory propagating signals.

Further, in some examples, the photonics chip 410 may include a photonics controller 412 and one or more photonic devices such as the ring resonator 102 of FIG. 1. For illustration purposes, in FIG. 4, the photonic chip 410 is shown to include a single optical device such as a ring resonator 102 of FIG. 1. The use of a different number of optical devices or the use of several different types of optical devices in the photonic chip 410 is also envisioned within the scope of the present disclosure. For example, the photonic chip 410 may also include other photonic devices such as but not limited to, or optical converters, optical cables, waveguides, optical modulators (e.g., ring modulator), optical demodulators (e.g., ring demodulator), resonators, light sources (e.g., lasers), and the like. The photonic chip 410 may function as an optical receiver, optical transmitter, optical transceiver, optical communication and/or processing medium for the data and control signals received from the photonics controller 412. Non-limiting examples of the photonics controller 412 may be implemented using an IC chip such as, but not limited to, an ASIC, an FPGA chip, a processor chip (e.g., CPU and/or GPU), a microcontroller, or a special-purpose processor. During the operation of the electronic system 400, the photonics controller 412 may send control and/or data signals to the ring resonator 102 to control the operations of the ring resonator 102.

Figure 5:
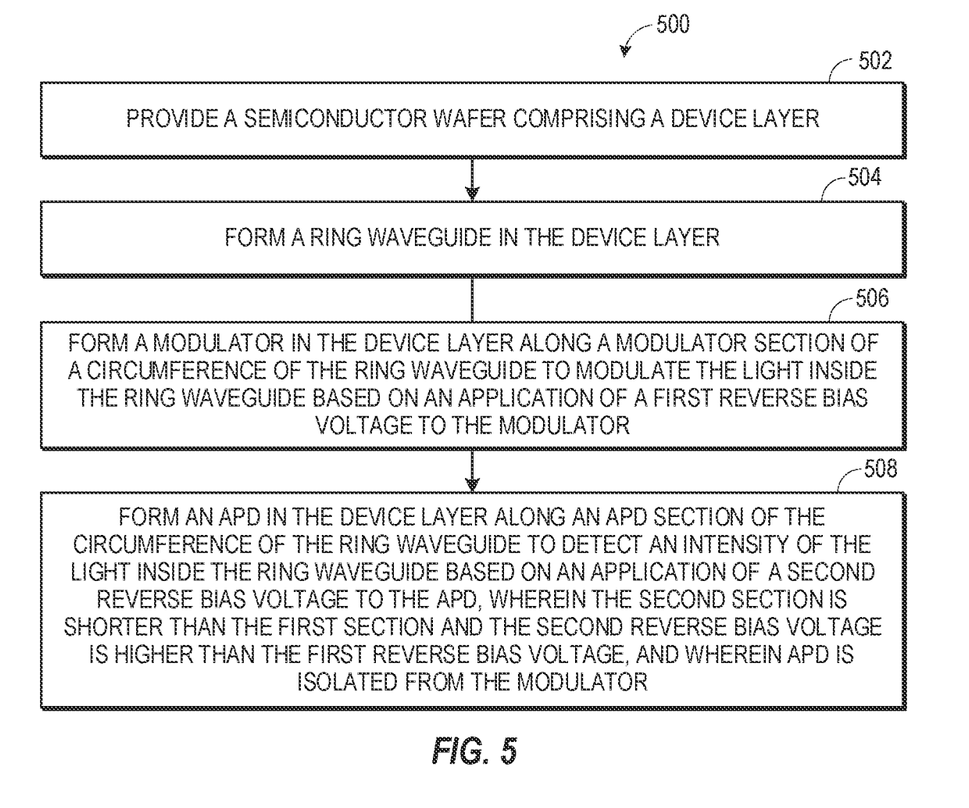
FIG. 5 is a flow diagram of an example method of forming an optical device such as the ring resonator 102 of FIGS. 1A-1D.

Referring now to FIG. 5, a flow diagram of an example method 500 of forming an optical device such as the ring resonator 102 of FIGS. 1A-1D is presented. For illustration purposes, the method 500 is described in conjunction with FIGS. 1A-1D. Although the steps in FIG. 5 are shown in an order, the order of steps shown in FIG. 5 should not be construed as the only order for the steps. The steps may be performed at any time, in any order. Some steps may even be performed in parallel. Additionally, the steps may be repeated or omitted as needed.

At step 502, a semiconductor wafer, such as, the semiconductor wafer 109 having the device layer 107 may be provided. Further, at step 504, a ring waveguide, such as the ring waveguide 104, may be formed in the device layer 107. Forming the ring waveguide 104 may include forming the outer annular region 118 and the inner annular region 120. The outer annular region 118 is formed in contact with and annularly surrounding the inner annular region 120.

Furthermore, at step 506, a modulator such as the modulator 170 may be formed in the device layer 107 along the modulator section 111 of a circumference of the ring waveguide 104. Additional details of forming the modulator 170 are described in conjunction with FIG. 6. During operation, the modulator 170 may aid in tuning the operating wavelength of the light inside the ring waveguide 104 based on an application of the first reverse bias voltage (V1) and the modulating signal (M) to the modulator 170. Moreover, at step 508, an APD, such as, the APD 172, may be formed in the device layer 107 along the APD section 113 of the circumference of the ring waveguide 104. Additional details of forming the modulator 170 are described in conjunction with FIG. 6. During operation, the APD may aid in detecting the intensity of the light inside the ring waveguide 104 based on an application of the second reverse bias voltage (V2) to the APD 172. In particular, the APD section 113 is shorter than the modulator section 111 and the second reverse bias voltage (V2) is higher than the first reverse bias voltage (V1). The APD 172 is electrically isolated from the modulator 170 via the isolating section 115.

Figure 6:
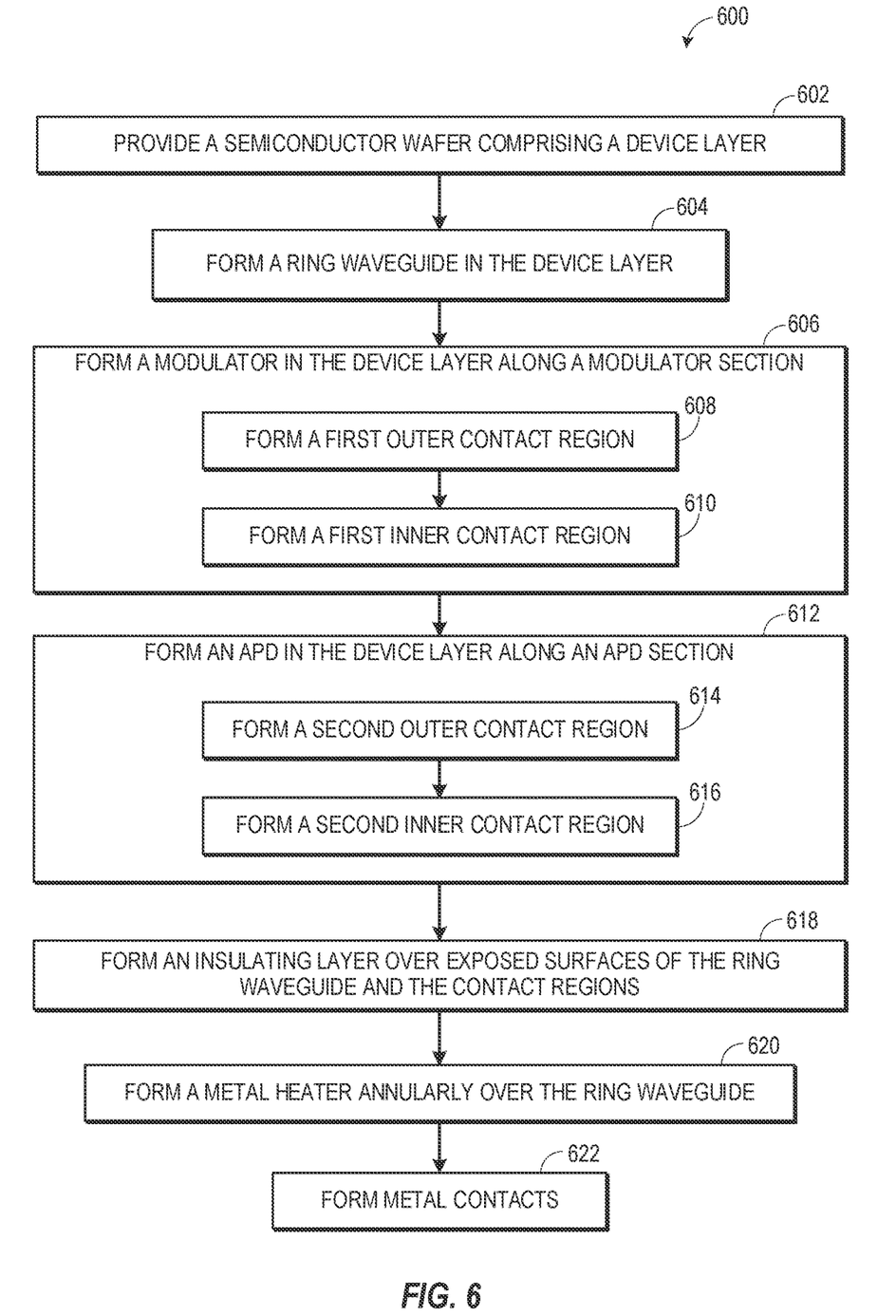
FIG. 6 is a flow diagram of another example method of forming an optical device such as the ring resonator 102 of FIGS. 1A-1D.

Moving now to FIG. 6, an example method 600 of forming an optical device such as the ring resonator 102 of FIGS. 1A-1D is presented. For illustration purposes, the method 600 is described in conjunction with FIGS. 1A-1D. Although the steps in FIG. 6 are shown in an order, the order of steps shown in FIG. 6 should not be construed as the only order for the steps. The steps may be performed at any time, in any order. Some steps may even be performed in parallel. Additionally, the steps may be repeated or omitted as needed.

At block 602, a wafer, such as the semiconductor wafer 109, including the device layer 107 made of a semiconductor material may be provided. Further, at block 604, the ring waveguide 104 may be formed in the device layer 107. Forming the ring waveguide 104 may include forming the outer annular region 118 and the inner annular region 120. The outer annular region 118 is formed in contact with and annularly surrounding the inner annular region 120. The outer annular region 118 may be doped using ion implantation and/or diffusion techniques to have the first-type doping along the modulator section 111 and the APD section 113. Further, the inner annular region 120 may be doped using ion implantation and/or diffusion techniques to have the second-type doping along the modulator section 111 and the APD section 113. The outer annular region 118 and the inner annular region 120 may be kept undoped/intrinsic along the isolating section 115.

Further, at step 606, a modulator such as the modulator 170 may be formed in the device layer 107 along the modulator section 111. In some examples, forming the modulator 170 may include forming, at step 608, a first outer contact region 134 in contact with the outer annular region 118 along the modulator section 111 of the circumference of the ring waveguide 104. Further, forming the modulator 170 may include forming, at step 610, a first inner contact region 136 in contact with the inner annular region 120 along the modulator section 111 of the circumference of the ring waveguide 104. The first outer contact region 134 and the first inner contact region 136 may be formed in the device layer 107. In particular, in some examples, forming the contact regions 134, 136 may include lithographically defining areas corresponding to contact regions 134, 136 on the device layer 107, doping the lithographically defined areas with respective impurities, and/or etching-out portions of the device layer 107 to form predetermined shapes of the contact regions 134, 136 as depicted in FIGS. 1A and 1B. In particular, the contact regions 134, 136 may be doped respectively with the first-type doping and the second-type doping using the ion implantation and/or diffusion techniques. During operation, the modulator 170 may aid in tuning the operating wavelength of the light inside the ring waveguide 104 based on an application of the first reverse bias voltage (V1) and the modulating signal (M) to the modulator 170 across the contact regions 134, 136.

Further, at step 612, an APD, such as, the APD 172, may be formed in the device layer 107 along the APD section 113 of a circumference of the ring waveguide 104. In some examples, forming the APD 172 may include forming, at step 614, a second outer contact region 135 in contact with the outer annular region 118 along the APD section 113 of the circumference of the ring waveguide 104. Further, forming the APD 172 may include forming, at step 616, a second inner contact region 137 in contact with the inner annular region 120 along the APD section 113 of the circumference of the ring waveguide 104. The second outer contact region 135 and the second inner contact region 137 may be formed in the device layer 107. In particular, in some examples, forming the contact regions 135, 137 may include lithographically defining areas corresponding to contact regions 135, 137 on the device layer 107, doping the lithographically defined areas with respective impurities, and/or etching-out portions of the device layer 107 to form predetermined shapes of the contact regions 135, 137 as depicted in FIGS. 1A and 1C. In particular, the contact regions 135, 137 may be doped respectively with the first-type doping and the second-type doping using the ion implantation and/or diffusion techniques. During operation, the APD 172 may aid in detecting an intensity of the light inside the ring waveguide 104 based on an application of the second reverse bias voltage (V2) to the APD 172. In particular, the APD section 113 is shorter than the modulator section 111 and the second reverse bias voltage (V2) is higher than the first reverse bias voltage (V1). The APD 172 is electrically isolated from the modulator 170 via the isolating section 115.

Furthermore, in some examples, at step 618, an insulating layer, such as, the insulating layer 117, may be formed (e.g., grown or deposited) over exposed surfaces of the ring waveguide 104 and the contact regions 134, 135, 136, and 137. In some examples, to form the insulating layer 117, a layer of oxide (e.g., $SiO_2$, $Si_3N_4$, $Al_2O_3$, $HfO_2$, polyimide, BCB, or the like) may be formed, via thermal growth techniques and/or using deposition techniques, such as, chemical vapor deposition (CVD), over the exposed surfaces of the ring waveguide 104 and the contact regions 134, 135, 136, and 137.

Furthermore, in some examples, at step 620, a metal heater, such as the metal heater 144, may be formed annularly over the ring waveguide 104. To form the metal heater 144, an area where the metal heater 144 is to be formed is lithographically defined and etched. Such etched space may then be filled with metal, such as, but not limited to, copper (Cu), gold (Au), Al, and/or platinum (Pt). Also, at block 622, one or more metal contacts (e.g., the metal contacts 145, 146, 147, 148, 149 may be formed in contact with the contact regions 134, 136, 135, 137, and the metal heater 144, respectively. To form the metal contacts 145, 146, 147, 148, 149 the electrically insulating layer 117 may be etched or lithographically defined to form respective vias until the respective contact regions 134, 136, or 162 are reached. Once the vias are formed, a conducting material (e.g., metal) is filled into the vias to form the metal contacts 145, 146, 147, 148, 149.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled to" as used herein, is defined as connected, whether directly without any intervening elements or indirectly with at least one intervening element, unless indicated otherwise. For example, two elements may be coupled to each other mechanically, electrically, optically, or communicatively linked through a communication channel, pathway, network, or system. Further, the term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. A ring resonator, comprising:
   a ring waveguide to allow passage of light therethrough;
   a modulator formed along a first section of a circumference of the ring waveguide to modulate the light inside the ring waveguide based on an application of a first reverse bias voltage to the modulator; and
   an avalanche photodiode (APD) isolated from the modulator and formed along a second section of the circumference of the ring waveguide to detect an intensity of the light inside the ring waveguide based on an application of a second reverse bias voltage to the APD, wherein the second section is shorter than the first section and the second reverse bias voltage is higher than the first reverse bias voltage.

2. The ring resonator of claim 1, further comprising a metal heater formed annularly over the ring waveguide to cause a shift in a wavelength of the light inside the ring waveguide based on an application of a third voltage to the metal heater.

3. The ring resonator of claim 1, wherein a ratio of a circumferential length of the first section to a circumferential length of the second section is in a range from 2:1 to 10:1.

4. The ring resonator of claim 1, wherein a circumferential length of the first section is more than half of the circumference of the ring waveguide.

5. The ring resonator of claim 1, wherein the ring waveguide comprises an outer annular region and an inner annular region, wherein the outer annular region is disposed in contact with and annularly surrounding the inner annular region.

6. The ring resonator of claim 5, wherein the modulator comprises:
 a first outer contact region in contact with the outer annular region along the first section of the circumference of the ring waveguide; and
 a first inner contact region in contact with the inner annular region along the first section of the circumference of the ring waveguide,
 wherein the first outer contact region comprises a first-type doping and the first inner contact region comprises a second-type doping.

7. The ring resonator of claim 6, further comprising:
 a first metal contact in contact with the first outer contact region; and
 a second metal contact in contact with the first inner contact region,
 wherein the first reverse bias voltage is applied across the first metal contact and the second metal contact.

8. The ring resonator of claim 5, wherein the APD comprises:
 a second outer contact region in contact with the outer annular region along the second section of the circumference of the ring waveguide; and
 a second inner contact region in contact with the inner annular region along the second section of the circumference of the ring waveguide,
 wherein the second outer contact region comprises a first-type doping and the second inner contact region comprises a second-type doping.

9. The ring resonator of claim 8, further comprising:
 a third metal contact in contact with the second outer contact region; and
 a fourth metal contact in contact with the second inner contact region,
 wherein the second reverse bias voltage is applied across the third metal contact and the fourth metal contact.

10. An electronic system, comprising:
 a circuit board;
 a processing resource mounted on the circuit board;
 a storage medium mounted on the circuit board and communicatively coupled to the processing resource; and
 a photonics chip communicatively coupled to the processing resource and comprising a ring resonator, the ring resonator comprising:
  a ring waveguide to allow passage of light therethrough;
  a modulator formed along a first section of a circumference of the ring waveguide to modulate the light inside the ring waveguide based on an application of a first reverse bias voltage to the modulator; and
  an APD isolated from the modulator and formed along a second section of the circumference of the ring waveguide to detect an intensity of the light inside the ring waveguide based on an application of a second reverse bias voltage to the APD, wherein a circumferential length of the first section is more than half of the circumference of the ring waveguide and the second reverse bias voltage is higher than the first reverse bias voltage.

11. The electronic system of claim 10, wherein the ring resonator further comprises a metal heater formed annularly over the ring waveguide.

12. The electronic system of claim 10, wherein the application of the second reverse bias voltage higher than the first reverse bias voltage enhances a responsivity of the APD along the shorter second section thereby allowing formation of the modulator over the longer first section compared to the second section resulting in an enhanced modulation efficiency of the modulator.

13. The electronic system of claim 10, wherein the photonics chip further comprises a photonics controller communicatively coupled to the ring resonator.

14. The electronic system of claim 10, wherein the ring waveguide comprises an outer annular region and an inner annular region, wherein the outer annular region is disposed in contact with and annularly surrounding the inner annular region.

15. The electronic system of claim 14, wherein the modulator comprises:
 a first outer contact region in contact with the outer annular region along the first section of the circumference of the ring waveguide; and
 a first inner contact region in contact with the inner annular region along the first section of the circumference of the ring waveguide,
 wherein the first outer contact region comprises a first-type doping and the first inner contact region comprises a second-type doping.

16. The electronic system of claim 14, wherein the APD comprises:
 a second outer contact region in contact with the outer annular region along the second section of the circumference of the ring waveguide; and
 a second inner contact region in contact with the inner annular region along the second section of the circumference of the ring waveguide,
 wherein the second outer contact region comprises a first-type doping and the second inner contact region comprises a second-type doping.

17. A method, comprising:
 providing a semiconductor wafer comprising a device layer;
 forming a ring waveguide in the device layer, wherein the ring waveguide allows passage of light therethrough;
 forming a modulator in the device layer along a first section of a circumference of the ring waveguide to modulate the light inside the ring waveguide based on an application of a first reverse bias voltage to the modulator; and
 forming an APD in the device layer along a second section of the circumference of the ring waveguide to detect an intensity of the light inside the ring waveguide based on an application of a second reverse bias voltage to the APD, wherein the second section is shorter than the first section and the second reverse bias voltage is higher than the first reverse bias voltage, and wherein APD is isolated from the modulator.

18. The method of claim 17, further comprising forming a metal heater annularly over the ring waveguide.

19. The method of claim 17, wherein the ring waveguide comprises an outer annular region and an inner annular region, wherein the outer annular region is disposed in contact with and annularly surrounding the inner annular region, and wherein forming the modulator comprises:
- forming a first outer contact region in contact with the outer annular region along the first section of the circumference of the ring waveguide; and
- forming a first inner contact region in contact with the inner annular region along the first section of the circumference of the ring waveguide,
- wherein the first outer contact region comprises a first-type doping and the first inner contact region comprises a second-type doping.

20. The method of claim 17, wherein the ring waveguide comprises an outer annular region and an inner annular region, wherein the outer annular region is disposed in contact with and annularly surrounding the inner annular region, and wherein forming the APD comprises:
- forming a second outer contact region in contact with the outer annular region along the second section of the circumference of the ring waveguide; and
- forming a second inner contact region in contact with the inner annular region along the second section of the circumference of the ring waveguide,
- wherein the second outer contact region comprises a first-type doping and the second inner contact region comprises a second-type doping.

* * * * *